United States Patent [19]

Pastor et al.

[11] 4,379,733
[45] Apr. 12, 1983

[54] BICAMERAL MODE CRYSTAL GROWTH APPARATUS AND PROCESS

[75] Inventors: Antonio C. Pastor, Santa Monica; Ricardo C. Pastor, Manhattan Beach; Kaneto Arita, Gardena, all of Calif.

[73] Assignee: Hughes Aircraft Company, El Segundo, Calif.

[21] Appl. No.: 307,986

[22] Filed: Oct. 2, 1981

[51] Int. Cl.³ ............................................. C30B 11/00
[52] U.S. Cl. ................................. 156/616 R; 422/248
[58] Field of Search ...... 156/616 R, 616 A, DIG. 63, 156/DIG. 66, DIG. 71, DIG. 78, DIG. 83, DIG. 89; 422/248

[56] References Cited

U.S. PATENT DOCUMENTS

| 3,139,653 | 7/1964 | Orem | 156/616 R |
| 3,273,969 | 9/1966 | Sirgo | 156/616 R |
| 3,514,265 | 5/1970 | Pastore | 422/248 |
| 3,591,340 | 7/1971 | Plaskett | 156/616 A |

FOREIGN PATENT DOCUMENTS 774270  5/1952  United Kingdom ................ 422/248

Primary Examiner—Hiram H. Bernstein
Attorney, Agent, or Firm—W. J. Bethurum; A. W. Karambelas

[57] ABSTRACT

An apparatus and process for growing large single halide crystals that are ultra pure is described. A bicameral apparatus and process is employed in which the crystals are grown in a reactive chamber positioned within an inert chamber. A radial seal is provided on the furnace chamber to facilitate the reaction and maintenance of an inert atmosphere around and about a crystal growth assembly wherein crystals are grown from a melt under a reactive atmosphere.

9 Claims, 2 Drawing Figures

BICAMERAL MODE CRYSTAL GROWTH APPARATUS AND PROCESS

TECHNICAL FIELD

This invention relates, generally, to the growth of single crystals from the melt of alkaline earth halides, alkali metal halides and rare earth halides. More particularly, this invention relates to an apparatus and process for growing single crystals of alkaline earth fluorides.

BACKGROUND OF THE INVENTION

1. Field of the Invention

This invention provides a new apparatus and process for use in preparing single crystals of alkaline earth fluorides from the melt which reduces the processing time and increases the purity of the resultant crystals while conserving reaction materials and energy.

2. Description of the Prior Art

In the prior art, single crystals of alkaline earth halides, rare earth halides and alkali metal halides have been grown from melts of selected reactants by crystal growth methods commonly known as the Czochralski-, Bridgman-Stockbarger-, or Storber-method or by various combinations thereof. These processes, and the apparatus intended to facilitate the preparation of crystals by the processes, are illustrated in U.S. Pat. Nos. 1,793,672; 3,139,653 and 4,242,589, all of which describe methods of forming crystals from a melt of various reactants under a static atmosphere.

The growth of alkaline earth chloride, bromide and iodide single crystals from a melt under a dynamic reactive atmosphere (RA) is disclosed in U.S. Pat. No. 4,190,487 issued to Ricardo C. Pastor et al in February 1980. The growth of alkali metal chloride bromide and iodide single crystals from a melt under a dynamic reactive atmosphere is disclosed in U.S. Pat. No. 4,076,574 issued to Ricardo C. Pastor et al in February 1978.

The use of a RA of hydrogen fluoride (HF) above the melt, during the crystal growth process to reduce contamination of fluoride crystals, is disclosed in: U.S. Pat. No. 3,649,552 issued to Morton Robinson et al for a "Method for Preparing High Quality Rare Earth and Alkaline Earth Fluoride Single Crystals" in March 1972; in U.S. Pat. No. 3,769,230 issued to Morton Robinson et al for "Calcium Fluoride Rare Earth Fluoride Fluorescent Compound Used as a Laser Crystal" in October 1973; and in U.S. Pat. No. 3,935,302 issued to Ricardo C. Pastor et al for "Preparation of Alkaline Earth Metal Halide Crystals for Laser Windows" in January 1976.

Each of the above-mentioned prior art devices and processes share one common limitation in that the crystals are grown in a crucible wherein the melt, and crystal subsequently grown therefrom, are exposed to the atmosphere existing within the furnace chamber. This defect renders it difficult, if not impossible, to remove all traces of anion and/or cation contaminants from the crystal growth atmosphere and thus from the crystals grown therein. The importance of removing $OH^-$ and $O^{--}$ contaminants from the crystal growth atmosphere of halide crystals is discussed at length in: U.S. Pat. Nos. 3,649,552; 3,769,230; 3,935,302; 3,959,442; 4,076,574; and 4,190,487. These teachings are incorporated herein by reference. However, notwithstanding the recognition of this importance by others, each of the prior art devices and processes which utilized the devices are limited in their ability to meet this need by the inherent outgassing characteristics of their respective crystal growth furnace. All of the prior art crystal growth furnaces comprised heating elements mounted within a chamber with baffles, shields and insulation. These elements were, and are, an essentially infinite source of contaminants. Before initiating a crystal growth process via prior art methods, the furnace chambers were either evacuated, flushed with an inert gas, filled with a reactive gas or flushed with a reactive gas as the temperature was raised to cause the reactants to melt. In the RA process disclosed by Pastor et al, the furnaces are vacuum baked and flushed with a reactive gas mixture for an extended time period prior to initiating recrystallization of the melt. This latter process, while relatively effective, required the expenditure of an enormous amount of energy and required an exceedingly large amount of reactant gases to getter $OH^-$ and $O^{--}$ contaminants. The bake-out and purge process requires large expenditures of time and it is not amenable to production operations. In addition, in many instances where fluoride crystals were being prepared under an HF atmosphere, the corrosive nature of HF tended to create more problems than it solved. HF has proven to be ineffective in gettering $OH^-$ and $O^{--}$ from the highly water-contaminated environment and in precluding the inclusion of said ions in the alkaline earth fluoride crystals.

Fluoride crystals could be prepared under a HF atmosphere using a platinum crucible of the design shown in U.S. Pat. No. 4,110,080 issued to Antonio Pastor. However, the expense of fabricating the crucible renders such a method impractical in a production facility. In addition, platinum forms carbon complexes at the temperatures involved which contaminate the crystals. Attempts to prepare fluoride crystals in a crucible of the "080" Pastor design fabricated from graphite failed when the crucible structural integrity failed. Thus, there is still a need for an apparatus and a process suitable for forming $OH^-$ and $O^{--}$ free alkaline earth fluoride single crystals and for efficiently forming other halide crystals which are $OH^-$ and $O^{--}$ free. The present invention is therefore the result of efforts intended to satisfy this need.

SUMMARY OF THE INVENTION

The general purpose of this invention is to provide ultra-pure alkaline earth halide, rare earth halide and alkali metal halide single crystals that are suitable for use in laser designs and applications. In accomplishing this purpose, while avoiding the disadvantages of the prior art and at the same time retaining the advantages of said art, we have provided an improved crystal growth apparatus which facilitates the growth of ultra-pure single crystals of numerous halides by a bicameral crystal growth process.

The novel crystal growth apparatus of our invention may be characterized as having a first crystal growth capsule assembly mounted within a chamber furnace by a sealing means which facilitates the creation and maintenance of an inert atmosphere around and about the capsule assembly wherein crystals are grown from the melt under a dynamic atmosphere containing a mixture of an inert gas and a reactive gas which getters $O^{--}$ and $OH^-$ contaminants. A furnace chamber, having a gas inlet and gas outlet means, is adapted for creating an inert atmosphere around and about a tubular capsule assembly by a radial seal that is mounted on an end plate of the chamber. The radial seal communicates with the walls of a tubular capsule assembly to entrap ambient gases and to facilitate a Bridgman-type movement of the assembly into the furnace chamber. The capsule assembly, mounted within the furnace chamber by the radial seal, is comprised of a lower conical section, a middle extension section and an upper section adapted for controllably receiving and discharging a reactive gas mixture.

The novel process of this invention entails the provision of a dynamic reactive atmosphere above the melt of selected halide reactants and directionally cooling the melt to cause crystallization to occur in a crucible assembly completely isolated from the ambient by an inert atmosphere. A capsule assembly which slidably moves Bridgman-fashion, into a furnace chamber adapted for raising the temperature of said assembly, and any reactants therein, over a defined reaction zone above the melting point of said reactants while providing an inert external environment for said assembly, is provided. The assembly is charged with selected reactants and a mixture of a reactive gas and an inert gas is flowed through the assembly. The furnace chamber is purged of its ambient atmosphere by flowing an inert gas therethrough as the temperature within the furnace is raised to cause the reactants in the assembly to melt. After all reactants have melted, crystallization from the melt is initiated by slowly lowering the assembly into the furnace to remove the reactant melt from the hot zone.

The provision of an inert environment for the vessel within which a reactive crystal growth environment is maintained eliminates contamination of the crystal melt and subsequently formed single crystals by contaminants which inherently diffuse throughout the furnace chamber upon heating. It is therefore one purpose of this invention to provide a crystal growth apparatus that is isolated from the furnace chamber and therefore does not contaminate halide crystals grown therein.

It is a further purpose of this invention to provide a crystal growth apparatus which does not require extensive baking under high energy loads for the purpose of outgassing of $OH^-$ and $O^{--}$ contaminants.

It is also a purpose of this invention to provide an apparatus for forming single crystals of various fluorides that is reusable with little or no maintenance and therefore cost effective.

And, a still further purpose of this invention is to provide a general process for forming ultra-pure single crystals of alkaline earth halides, alkali metal halides and rare earth halides that is susceptible to adaptation for use in the commercial production of such crystals.

That we have substantially accomplished the above-stated purposes will become clear upon reference to the following brief description of the drawings and detailed description of the invention.

DETAILED DESCRIPTION OF THE INVENTION

Figure 1:
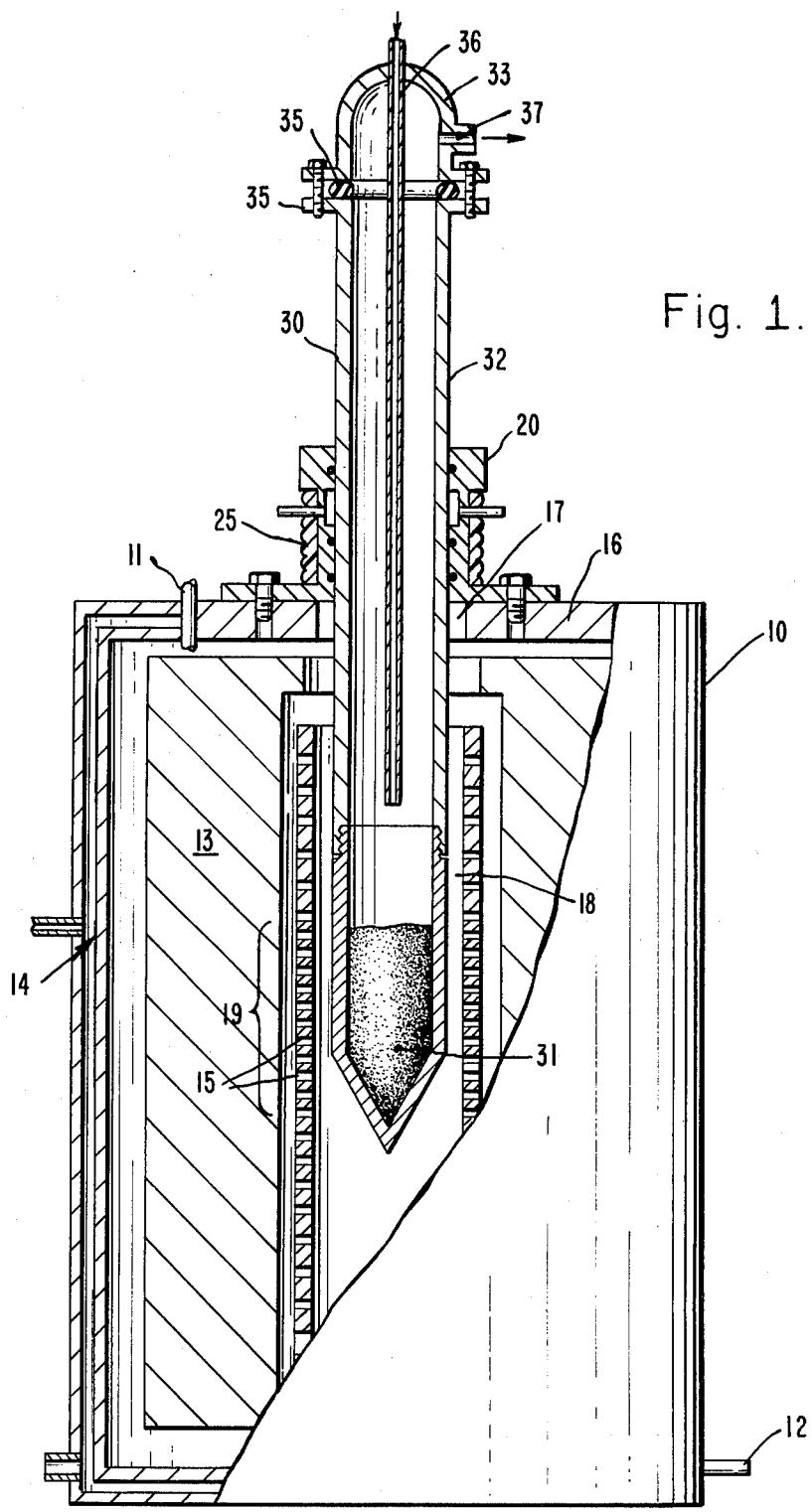
FIG. 1 is a partial, longitudinal, sectional view of the crystal growth apparatus of this invention.

According to the present invention, there is provided a bicameral, or two-chamber, process for growing large single halide crystals in general, and for growing large single fluoride crystals in particular, which comprises the steps of: placing selected reactants in a closed crystal growth crucible assembly (i.e., chamber No. 1) that is capable of providing and maintaining a dynamic reactive atmosphere therein; providing an inert thermal atmosphere in a second chamber located around and about the closed crystal growth assembly wherein melts of selected reactants are first formed and subsequently cooled under a dynamic reactive atmosphere; increasing the temperature of said inert atmosphere over a predescribed hot zone to a level sufficient for forming a melt of said reactants while exposing said reactants to a continuous flow of a gaseous mixture of inert and reactive gases; and subsequently causing the melt to recrystallize into a large single crystal by initiating a Bridgman-type movement of said assembly which causes the melt to move from the predescribed hot zone within the inert atmosphere to a cooler zone within said atmosphere.

The dynamic reactive atmosphere (RA) within the novel crystal growth assembly serves to first remove all $OH^-$ and $O^{--}$ contaminants from the reactant melt, and it precludes inclusion of $OH^-$ and/or $O^{--}$ contaminants in the lattice of crystals subsequently grown from the melt as the temperature of the melt is lowered to facilitate nucleation and crystal growth.

This process differs from prior art processes in that the provision of an inert atmosphere around and about the crystal growth vessel serves to reduce the volume of the crystal growth environmental atmosphere and thus the quantity of reactive gases needed to getter undesirable $OH^-$ and $O^{--}$ from the intermediate crystal growth environment. In contrast to prior art processes, the isolation of the crystal growth atmosphere from the ambient by an inert atmosphere eliminates the necessity of vacuum baking the crystal growth furnace chamber for extended time periods to eliminate outgassing of contaminants from the interior surface of the furnace, and it reduces time and materials needed to effectively grow large single crystals in an RA. As a consequence, it is now possible to consistently produce reproducible ultra-pure large single crystals of rare earth fluorides, alkali fluorides and alkaline earth fluorides, as well as other halides and to utilize the same apparatus and crucible over and over with little or no maintenance.

The bicameral apparatus designed to facilitate the preparation of large halide single crystals by the above-stated process is shown in the drawings which depicts a cylindrical furnace chamber 10 adapted for receiving by an inlet means 11 and discharging by outlet means 12, an inert gas purge. The chamber 10, sold under the name Astro Furnace by Astro Industries Incorporated of Santa Barbara, Calif., has graphite insulation 13, a water jacket 14, and a graphite variable resistance heating element 15 as is commonly known in the art. The furnace 10 is modified to include a radial seal 20 mounted on a top plate 16 which accommodates a tubular crucible assembly 30 that projects into the furnace 10 through a port 17 that is located in the center of the top plate 16. Unlike prior art furnaces, the atmosphere 18 within the interior of the furnace chamber 10 is isolated from the ambient by a radial seal 20 which allows a Bridgman-type movement of the crucible assembly 30 (The phrase "Bridgman-type movement" is understood, by those skilled in the art, to mean a movement whereby a crucible containing a selected charge is moved from a hot zone 19, predescribed by a variable resistance heating element which creates a select thermal profile within the furnace, into a cooler zone within the same furnace by a pushing or lowering mechanism.). The tubular crucible 30 contains a lower portion 31 for receiving a charge joined to an elongated middle extension portion 32 that is adapted for forming a closed capsule when joined to an upper portion 33 by a flange 34 and seal 35 arrangement. When assembled and charged with reactants, reactive gaseous mixtures are fed into the crucible through an inlet tube 36, located in the upper portion 33 of the crucible, that directs the flow of gases perpendicular to the surface of the reactants in the lower portion 31. An outlet means 37 is provided in the upper portion 31 to facilitate the removal of effluent gases.

In practice, a charged crucible assembly 30 is placed within the radial seal 20 such that the lower portion, containing the reactants, is juxtaposed with the predescribed hot zone 19 of the furnace. An inert gas such as argon or helium is passed through the furnace chamber, as the temperature of the hot zone is elevated to form a melt from the reactants in the crucible, and through the radial seal 20 which holds the crucible 30. Simultaneously, a mixture comprising a reactive gas, such as HF, and helium is passed through the crucible assembly at a flow rate of from 50 to 100 ml/minute. (In those instances where halides other than fluorides are being grown, other mixtures of nascent halogen source compounds and inert gases may be utilized.) A melt of the reactants is thereby formed within the crucible assembly under a purge of the dynamic reactive gas mixture and allowed to stand for about 0.5 to 1 hr. Crystal growth from the melt is initiated by lowering the entire crucible assembly 30 through the seal 20 to cause the lower portion 31 to pass from the hot zone thereby gradually lowering the temperature of the melt from the bottom end of the crucible (i.e., a Bridgman-type movement). The reactive gaseous purge through the crucible assembly is maintained throughout the entire procedure until the resulting crystal is allowed to cool down.

Figure 2:
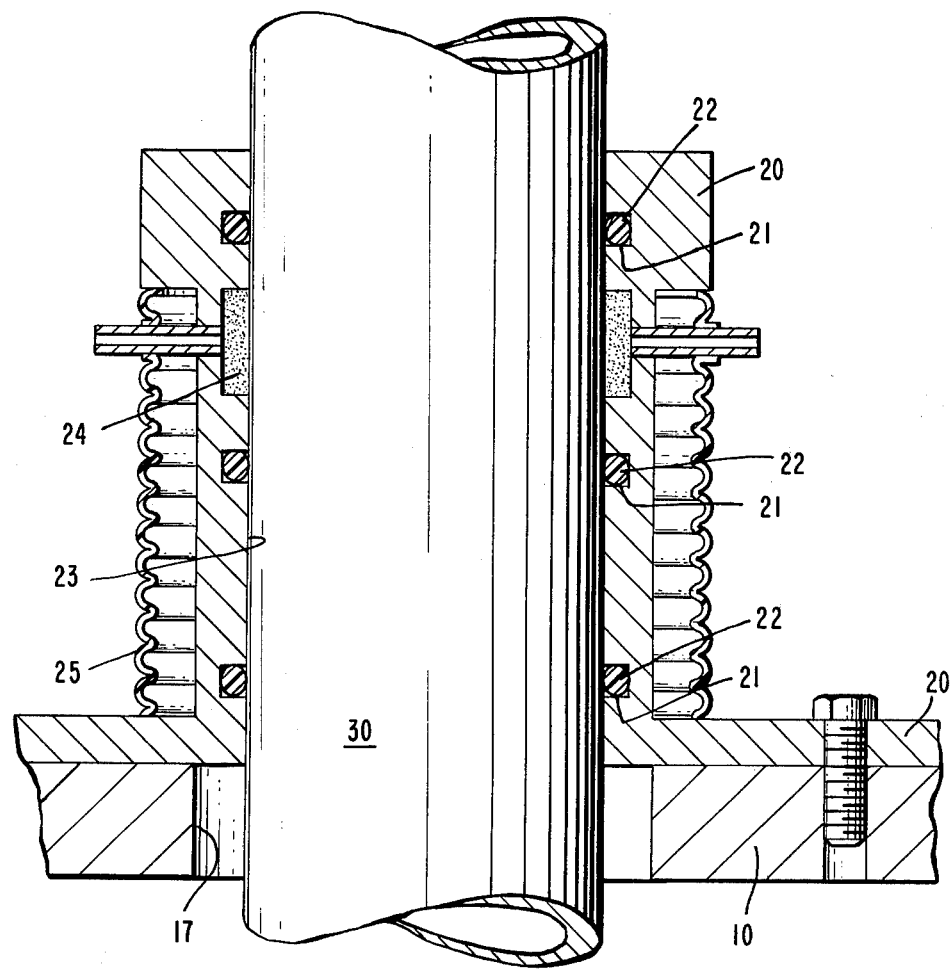
FIG. 2 is a sectional view of the seal which facilitates a Bridgman movement of the crucible capsule assembly into the furnace chamber while maintaining an inert atmosphere therein.

In order to facilitate a Bridgman-type movement of the entire tubular capsule crucible assembly 30 through hot portions of the heating element 15, the radial seal 20, shown in FIG. 2, contains grooves 21 for retaining at least two sealing means 22 within its inner face 23, which lightly communicate with the external walls of the assembly 30. It is necessary to entrap ambient gases which may be adsorbed on the walls of the crucible assembly to preclude oxygen from entering the inert atmosphere 18. This is accomplished by providing a rectangular channel 24 which functions as a gas trap, within the inner face 23 of the radial seal 20 between two of the sealing means 22 and adapting said channel to receive and discharge an inert gas purge which entraps and removes any oxygen containing gaseous species which may be adsorbed onto the external surface of the crucible 30 as it is slowly pushed or lowered into the inert atmosphere 18 of the chamber 10. Inasmuch as heat absorbed by the crucible 30 tends to radiate from its lower portion 31 to the middle portion 32, it is necessary to protect the sealing means 22 by providing a cooling means 25 disposed about the outer face 26 of the radial seal 20. For this purpose, a tubular coil 25, through which liquid coolant is passed, is disposed around and about the outer face 26 of the sealing means in order to dissipate heat radiated from within the chamber furnace through the walls of the crucible assembly. The cooling coil 25 and the gas trap 24 also tend to dissipate heat from the middle and upper portions, 32 and 33, of the crucible walls that are exposed to ambient atmosphere. In those instances where the capsule assembly is of necessity or convenience made of graphite, i.e, fluoride crystal growth processes, this feature is necessary to preclude the walls of the assembly from reaching the combustion temperature of graphite in air.

We have fabricated radial seals from stainless steel housings and fluorocarbon elastomer O-rings sold by E. I. DuPont de Nemours of Wilmington, Del. under the trade name Viton. However, any metallic housing having a high heat dissipation factor may be used, and other suitable materials may be used as sealing means. The gas trap 24 within the inner face of the metallic housing 20 may be formed with one O-ring positioned above and one O-ring positioned below the rectangular channel 24 formed within the inner face of the housing. However, a more perfect seal is accomplished with three O-rings with one O-ring above the channel and two O-rings below the channel to form the gas trap.

As a consequence of providing an inert thermal atmosphere for the crystal growth crucible, the entire crystal growth process is rendered cost effective, relatively low cost graphite crucibles may be employed, there is no longer a need to vacuum bake the furnace chamber, the volume of reactive gas needed to getter $OH^-$ and $O^{--}$ contaminants is substantially reduced and corrosion problems are minimized. In addition, a three component crucible assembly further reduces operating cost in that, as it is sometimes necessary due to unavoidable accidents or mistakes, individual sections of the crucible assembly may be replaced without incurring the expense associated with the provision of an entirely new assembly. Further, it is possible to switch charges within the assembly without cross contamination from one crystal growth run to the next.

Another advantage of the design of the crystal growth assembly lies in the method of introducing the RA gas mixture into the crucible. In prior art crucibles, such as that disclosed in U.S. Pat. No. 4,110,080, there is a tendency to form a two-phase gas equilibrium above the melt. The first phase, and the phase directly in contact with the melt, is comprised of melt vapors. The second phase is the reactive atmosphere above the melt vapor. This phenomena precludes an efficient removal of contaminants from the melt. By introducing the gas mixture through the top of assembly and directing the flow of gas directly upon the surface of the reactants, and later upon the melt, a more efficient gettering action is accomplished. There is little or no chance for a state of equilibrium to be formed between the partial pressure of the melt vapors and the reactive atmosphere created by the impinging gas mixture.

INDUSTRIAL APPLICABILITY

The process and apparatus of this invention may be used for the production of alkaline earth fluoride single crystals and other fluoride crystals of extremely high purity. It may also find application in the preparation of other alkaline earth-, alkali metal-, and rare earth-halide crystals. It is readily adaptable for use in pilot plant operations at a considerable cost savings when compared to prior art processes and apparatus designed to grow single crystals.

Having completely described this invention, and having provided teachings to enable others to make and utilize the same, the scope of our claims may now be understood as follows:

What is claimed is:

1. A bicameral apparatus for forming alkaline earth halide, rare earth halide and alkali metal halide crystals from the melt of the selected reactants in a dynamic reactive atmosphere, comprising a furnace chamber having a gas inlet and gas outlet means to facilitate the provision of an inert environment therein, and a tubular capsule assembly, where said chamber is provided with a top plate containing a port, above which is mounted a radial seal adapted for excluding oxygen-containing species from said chamber while facilitating a Bridgman-type movement of said assembly into said chamber, said radial seal including (1) gas trap means for trapping and removing any oxygen-containing gaseous species that may be absorbed on the walls of said capsule assembly and (2) sealing means on each side of said gas trap means, and wherein said assembly is characterized by a detachable charge holding lower section, a middle section, and a reusable upper section, said upper section being adapted for controllably receiving and discharging a mixture of an inert gas and a reactive gas to thereby provide a dynamic atmosphere which eliminates oxygen-containing anion impurities from said melt and from crystals grown therefrom and wherein said dynamic atmosphere in said assembly is prevented from communicating with said inert atmosphere in said furnace chamber.

2. An apparatus in accordance with claim 1 wherein said seal comprises a cylindrical metallic housing having: an inner face, with a rectangular channel disposed therein that is adapted for receiving and discharging an inert gas purge, and a means for retaining at least one sealing means on each side of said channel, within said inner face to communicate with said capsule assembly to form an oxygen trap; and an outer face containing a series of coils disposed thereon which facilitate the introduction of liquid coolant to dissipate heat conducted from within said chamber by said capsule assembly.

3. An apparatus in accordance with claim 1 or claim 2 wherein said capsule assembly is fabricated from graphite to facilitate the use of HF as a reactive atmosphere.

4. A modified Bridgman crystal growth apparatus that is capable of operating in a bicameral mode to yield ultra-pure single crystals of alkaline earth halides, rare earth halides and alkali metal halides comprising:

a cylindrical furnace chamber adapted for receiving and discharging an inert gas purge to thereby create an inert atmosphere within said chamber; and a tubular crucible assembly adapted for receiving and discharging a mixture of reactive gases to thereby create a reactive atmosphere within said assembly, wherein said reactive atmosphere in said crucible assembly is prevented from communicating with said inert atmosphere in said furnace chamber and wherein said assembly is slidably mounted in a port at the top of said chamber to project into said chamber by a radial seal which facilitates a Bridgman-type movement of said assembly while excluding ambient gases from said chamber, said radial seal including (1) gas trap means for trapping and removing any oxygen-containing gaseous species that may be absorbed on the walls of said capsule assembly and (2) sealing means on each side of said gas trap means, thereby maintaining an inert atmosphere for said assembly during all phases of a crystal growth process.

5. An apparatus in accordance with claim 4 wherein said seal comprises a metallic housing having an inner face and an outer face, where said inner face contains a rectangular channel disposed therein and at least one groove, on both sides of said channel, for retaining a sealing means placed therein which communicates with the walls of said tubular assembly to thereby form a gas trap; and where said outer face has a multiplicity of tubular coils disposed thereon and adapted for receiving and discharging a liquid coolant to dissipate heat conducted to said sealing means.

6. An apparatus of claim 5 wherein said sealing means are O-rings.

7. An improvement in the process of forming alkaline earth halide, rare earth halide and alkali metal halide crystals from the melt of selected reactants under a dynamic reactive atmosphere where said improvement comprises the steps of forming said melt, soaking said melt and cooling said melt by a Bridgman-type movement under said reactive atmosphere in a capsule assembly that is positioned within a furnace chamber and isolated from ambient gases by (1) an inert atmosphere created within said chamber, said inert atmosphere being prevented from communicating with said reactive atmosphere and (2) a radial seal which includes a gas trap means for entrapping and removing any oxygen-containing gaseous species that may be absorbed on said capsule assembly, together with sealing means on each side of said gas trap means.

8. An improvement in the process of forming alkaline earth halide, rare earth halide, and alkali metal halide crystals from the melt of selected reactants in the presence of a dynamic reactive atmosphere wherein said improvement comprises:

providing a capsule assembly which slidably moves, Bridgman fashion, into a furnace chamber adapted for raising the temperature of said assembly and any reactants placed therein above the melting point of said reactants while providing an inert external environment for said assembly;

charging said assembly with selected reactants and subsequently creating a reactive atmosphere within said assembly by causing a mixture of an inert gas and a reactive gas to flow through said assembly;

purging said furnace chamber of all oxygen-containing gaseous species by flowing an inert gas therethrough while raising the temperature within said chamber within said defined zone to a selected level sufficient to form a melt of said reactants, said inert atmosphere being prevented from communicating with said reactive atmosphere, thereby providing an inert external environment for said assembly which preserves the integrity of said assembly and reduces the quantity of reactive gas mixtures required to ensure formation of oxygen containing contaminant-free crystals and further preventing oxygen-containing gaseous species absorbed on the surface of said assembly from reacting with said melt by providing a radial seal around said assembly which includes a gas trap and sealing means on either side of said gas trap; and slowly lowering said assembly through said radial seal into said chamber to thereby remove said melt from said hot zone to facilitate crystal growth from the melt as the temperature of the melt is lowered.

9. An improved process for forming alkaline earth halide crystals, rare earth halide crystals and alkali metal halide crystals from the melt of selected reactants under reactive atmospheres comprising:

providing a bicameral crystal growth apparatus having a reactive atmosphere capsule assembly slidably positioned within an inert atmosphere chamber that is adapted for creating and maintaining a selected temperature profile through a preselected zone, said crystal growth apparatus provided with a radial seal means through which said capsule assembly slidably passes which includes gas trapping means for trapping and removing any oxygen-containing gaseous species absorbed on the surface of said capsule assembly and sealing means on either side of said gas trapping means;

charging said reactive atmosphere assembly with selected reactants;

placing said charged assembly within said inert chamber and subsequently simultaneously initiating the flow of a reactive gas-inert carrier gas mixture into said charged assembly and an inert gas into said inert chamber thereby forming a reactive atmosphere and an inert atmosphere within the respective enclosures, which are prevented from communicating with each other;

raising the temperature within said inert chamber to a selected level throughout said preselected zone suitable for forming a melt of said reactants, and allowing said melt to soak in said reactive atmosphere for a period of from about 0.5 to 1 hours; and subsequently slowly removing said reaction chamber from said zone while maintaining its reactive atmosphere thereby decreasing the temperature of said melt whereby crystallization will occur.

* * * * *